(12) United States Patent
Miller et al.

(10) Patent No.: US 7,699,616 B2
(45) Date of Patent: Apr. 20, 2010

(54) HIGH DENSITY PLANAR ELECTRICAL INTERFACE

(75) Inventors: Charles A. Miller, Fremont, CA (US); Benjamin N. Eldridge, Danville, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 12/034,110

(22) Filed: Feb. 20, 2008

(65) Prior Publication Data

US 2008/0150571 A1 Jun. 26, 2008

Related U.S. Application Data

(62) Division of application No. 11/532,801, filed on Sep. 18, 2006, now Pat. No. 7,335,057, which is a division of application No. 09/886,521, filed on Jun. 20, 2001, now Pat. No. 7,108,546.

(51) Int. Cl.
*H01R 29/00* (2006.01)
(52) U.S. Cl. ............... 439/45; 439/75; 439/289; 439/204; 324/761
(58) Field of Classification Search .......... 439/45, 439/75, 936, 493, 289, 78
See application file for complete search history.

(56) References Cited

U.S. PATENT DOCUMENTS

| | | | |
|---|---|---|---|
| 4,139,727 A | 2/1979 | Kuballa | |
| 4,679,321 A | 7/1987 | Plonski | |
| 4,842,527 A | 6/1989 | Tellam | |
| 4,941,831 A | 7/1990 | Tengler et al. | |
| 5,068,602 A | 11/1991 | Mielke | |
| 5,273,457 A | 12/1993 | Zell et al. | |
| 5,344,338 A | 9/1994 | Colleran et al. | |
| 5,552,752 A | 9/1996 | Sturdivant et al. | |
| 5,612,657 A | 3/1997 | Kledzik | |
| 5,886,590 A | 3/1999 | Quan et al. | |
| 5,945,838 A * | 8/1999 | Gallagher et al. | 324/761 |
| 6,152,744 A | 11/2000 | Maeda | |
| 6,233,818 B1 * | 5/2001 | Finn et al. | 29/843 |
| 6,297,657 B1 * | 10/2001 | Thiessen et al. | 324/761 |
| 6,379,781 B1 * | 4/2002 | Suzuki et al. | 428/209 |
| 6,459,039 B1 | 10/2002 | Bezama et al. | |

(Continued)

FOREIGN PATENT DOCUMENTS

JP 03-177038 8/1991

(Continued)

*Primary Examiner*—Truc T Nguyen
(74) *Attorney, Agent, or Firm*—N. Kenneth Burraston

(57) ABSTRACT

An apparatus including a substrate having a plurality of through holes and a plurality of cables, including wires and/or coaxial cables, extending through respective ones of the plurality of through holes of the substrate. Each of the cables comprises a conductor and terminates about a surface of the substrate such that the conductors of respective ones of plurality of cables are planarly aligned and available for electrical contact. A system including a cable interface extending through respective ones of a plurality of through holes of a body of the interface; an interconnection component comprising a first plurality of contact points aligned with respective ones of conductors of the plurality of cables and a second plurality of contact points aligned to corresponding contact points of a device to be tested. Also, a method of routing signals through the conductors of the plurality of cables between electronic components.

9 Claims, 12 Drawing Sheets

U.S. PATENT DOCUMENTS

| | | |
|---|---|---|
| 6,624,648 B2 | 9/2003 | Eldridge et al. |
| 6,790,051 B1 * | 9/2004 | Secall et al. .................. 439/78 |
| 6,917,102 B2 | 7/2005 | Zhou et al. |
| 7,108,546 B2 | 9/2006 | Miller et al. |
| 7,335,057 B2 | 2/2008 | Miller et al. |

FOREIGN PATENT DOCUMENTS

| | | |
|---|---|---|
| JP | 08-110366 | 4/1996 |
| JP | 11-108955 | 4/1999 |
| JP | 2000-088920 | 3/2000 |

* cited by examiner

HIGH DENSITY PLANAR ELECTRICAL INTERFACE

BACKGROUND

1. Field

The invention relates to coupling electronic components and, in one aspect, to techniques for performing test and burn-in procedures on integrated circuit devices prior to their packaging, preferably prior to the individual devices being singulated from a wafer.

2. Background

Individual integrated circuit devices (dies) are typically produced by creating several identical devices on a semiconductor wafer, using known techniques of photolithography, deposition, and the like. Generally, these processes are intended to create a plurality of fully-functional integrated circuit devices prior to singulating (severing) the individual dies from the wafer. In practice, however, certain defects in the processing of the wafer inevitably lead to some of the dies being "good" (fully-functional) and some of the dies being "bad" (partially-functional or non-functional). It is generally desirable to be able to identify which of the plurality of dies on a wafer are good dies prior to their packaging, and preferably prior to their being singulated from the wafer. To this end, a device or a wafer "tester" or "prober" may advantageously be employed to make a plurality of discrete pressure connections to a like plurality of discrete connection pads (bond pads) on the dies. In this manner, the des can be tested and exercised prior to packaging, and preferably, prior to singulating the dies from the wafer.

A die or a plurality of dies on a wafer may be tested using an automated test system. Such a test system usually includes a processor that executes a test program engineered for testing devices (dies) under test ("DUTs"). A "probe card assembly" receives the test data from the processor and delivers it to locations in the DUTs. Typically, a plurality of probe elements are connected to the probe card assembly to effect pressure connections to respective bond pads of DUTs to effectuate the testing.

One type of probe card assembly includes a probe card. Probe cards are typically conventional circuit board substrates (e.g., of epoxy-impregnated fiberglass material) formed as circular rings, with hundreds of probe elements (needles) bonded to, and extending from an inner periphery of, the ring. Circuit modules and conductive traces (lines) of preferably equal lengths, are associated with each of the probe elements.

A second representative type of probe card assembly is described in commonly-owned, U.S. Pat. No. 5,974,662 issued Nov. 2, 1999, titled "Method of Planarizing Tips of Probe Elements of a Probe Card Assembly," and U.S. Pat. No. 6,050,829 issued on Apr. 18, 2000, titled "Making Discrete Power Connections to a Space Transformer of a Probe Card Assembly," each incorporated herein by reference. In one embodiment, the probe card assembly includes as its major functional components a probe card, an interposer, and a space transformer. The probe card is a circuit board substrate having terminals arranged about an inner periphery at a suitable pitch such as a 100 mil pitch.

To reduce the contact pitch of the probe card to a pitch of a DUT, a space transformer may be utilized. A typical space transformer, for example as described in U.S. Pat. No. 6,050,829, includes a suitable circuitized substrate, such as a multilayer ceramic substrate having a plurality of terminals disposed on opposites sides thereof. Interconnection elements, such as resilient interconnection elements described in the referenced, commonly-owned documents are used to couple the space transformer to the probe card and to a DUT. To couple to the probe card, the contact pads and/or interconnection elements are disposed at the pitch of the corresponding pads of the probe card (e.g., 100 mils), and the plurality of contact pads and/or interconnection elements to be coupled to a DUT may be disposed at a finer (closer) pitch of, for example, 50 mils, with ends of the interconnection elements coupling to contacts of the DUT at possibly an even finer pitch (e.g., a 10 mil pitch).

Between the space transformer and the probe card, an interposer may be employed to provide dimensional stability to the probe card assembly and adjust the planarity of the assembly in a Z-dimension to improve the electrical contact between the assembly and DUTs. One interposer is, for example, and as described in U.S. Pat. No. 5,974,662, a dielectric substrate having interconnection elements, including any of the resilient interconnection elements noted above, mounted to and extending from opposite sides of the substrate. The pitch of the interconnection elements is selected to correspond to the pitch of the probe card contact pads and the space transformer contact pads, respectively.

As described above, a typical probe card has hundreds or thousands of probe elements or terminals about an inner periphery and wired to conductive traces through the probe card to terminals. Such terminals may be disposed along an outer periphery of the probe card ring. Typically, conductive probe pins, such as "pogo pins," electrically connect these terminals to host equipment such as a processor that executes a test program through a test head and associated circuitry.

One concern to designers of probe card assemblies is that to get from the pin electronics of the host equipment to the probe tips on the probe card, the signals must travel through a multi-element signal path (e.g., pogo pins, terminals, traces, etc.). These various elements have physical and electrical performance limitations that adversely affect conventional tester technology. For example, the pogo pins and their terminal coupling have certain known performance limitations which are addressed by matching pad capacitance and impedance to some arbitrary values. The probe card board material represents a further performance limitation in that the loss tangent of typical FR4 fiberglass material is such that even a few inches of this material in the signal path can represent significant attenuation and signal distortion.

Controlling impedance characteristics (capacitance, inductance, and contact resistance) and minimizing crosstalk between a multiplicity of signals, typically several hundreds, from the tester pin electronics to the device under test microcircuit represents a significant technical challenge. What is needed is improved tester technology that reduces the performance limitations of the conventional tester technology.

SUMMARY

An apparatus is disclosed. In one embodiment, the apparatus includes a substrate having a plurality of through holes and a plurality of cables, including wires and/or coaxial cables, extending through respective ones of the plurality of through holes of the substrate. Each of the cables comprises a conductor and terminates about a surface of the substrate such that the conductors of respective ones of plurality of cables are planarly aligned and available for electrical contact. The plurality of through holes of a substrate may be configured such that the conductors are aligned with respect to contact points of an electronic component, including an integrated circuit device, a device package, a socket, or a circuit test component such as an interposer or space transformer of an integrated circuit test assembly. In terms of testing systems, the apparatus may serve as an interface between a DUT and host test equipment, eliminating a probe card and pogo pins and their associated performance limitations.

A system is also disclosed. In one embodiment, the system comprises a cable interface comprising a plurality of cables, including wires and/or coaxial cables, extending through respective ones of a plurality of through holes of a body of the interface; an interconnection component comprising a first plurality of contact points aligned with respective ones of conductors of the plurality of cables and a second plurality of contact points aligned to corresponding contact points of a device to be tested. The system further includes a testing component coupled to a second end of the plurality of coaxial cables and comprising circuitry to test a device.

A method is further disclosed. In one embodiment, the method includes assembling a plurality of cables, including wires and/or coaxial cables, in an array suitable for accessing contact points of a device to be tested with respective conductors of the plurality of the cables, and routing signals through the conductors of the plurality of cables between a testing component and a device.

DETAILED DESCRIPTION

An apparatus suitable as an interface between electronic components; a testing system; and a method of routing signals between a tester and an electronic component are described. In terms of integrated circuit device testing, including wafer or device-level testing, the apparatus, system and method, offer an improvement over prior art technologies by eliminating, in one regard, a probe card and its assorted components (e.g., pogo pins, terminals, tracing, etc.). In this manner, the various embodiments described address the performance limitations of probe cards and their assorted components regarding DUT tester technology.

Figure 1:
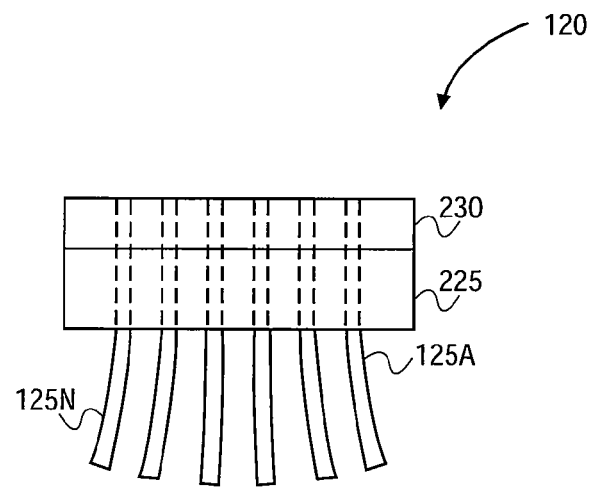
FIG. 1 shows a schematic, cross-sectional side view of one embodiment of a cable interface.

FIG. 1 shows a schematic cross-sectional view of an embodiment of a cable interface. Cable interface 120 includes a plurality of cables 125A . . . 125N extending therethrough. As described herein, cables 125A . . . 125N include conductive wires, such as solid or stranded copper wires, and cables, such as coaxial cables or a mixture of conductive wires and coaxial cables. Cables 125A . . . 125N are potted in second substrate body 230 so that conductive ends (conductors) of cables 125A . . . 125N are exposed and planarly aligned.

In one embodiment, cable interface 120 is configured to function as an electrical interface between contacts or interconnections of two electronic components. Cables 125A . . . 125N may act as signal lines between two devices and/or supply and return lines between electronic components. Exposed conductors of cables 125A . . . 125N through second substrate body 230 (and about a surface of cable interface 120) are a first plurality of contact points of cable interface 120 with an electronic component. Suitable electronic components for contacting with exposed conductors of cables 125A . . . 125N include, but are not limited to, an integrated circuit device, a device package, a socket, and components of a testing system, such as a space transformer and/or an interposer. It is appreciated that the number and pitch of corresponding contact points of the electronic component will dictate, in part, the number and pitch of cables 125A . . . 125N disposed in cable interface 120. Referring to FIG. 1, cables 125A . . . 125N are fixedly arranged within first substrate body 225 according to an array suitable for, in one instance, an electrical component to which such cables will contact.

The exposed conductors about the surface of cable interface 120 act as contact points for coupling to an electronic component. Such contact points may be engaged by, for example, interconnection elements. Such interconnections may make temporary pressure connections with the conductors of cable interface 120 or make more permanent connection through bonding of the interconnection elements to the conductors. In the latter example, cable interface 120 may form part of a device socket for coupling to an electronic component, with, for example, a socket housing coupled to the body of cable interface 120.

Suitable interconnection elements for coupling to contact points (conductors) of cable interface 120 include, but are not limited to, interconnection elements described in the following commonly-owned applications and patents incorporated herein by reference:

1) U.S. Pat. No. 5,974,662 issued Nov. 2, 1999, titled "Method of Planarizing Tips of Probe Elements of a Probe Card Assembly";

2) U.S. Pat. No. 5,476,211 issued Dec. 19, 1995, titled "Method of Manufacturing Electrical Contacts Using a Sacrificial Member";

3) U.S. patent application Ser. No. 09/397,779, filed Sep. 16, 1999, titled "Electronic Assembly Comprising a Substrate and a Plurality of Springable Interconnection Elements Secured to Terminals of the Substrate";

4) U.S. patent application Ser. No. 09/245,499, filed Feb. 5, 1999, titled "Method of Manufacturing Raised Electrical Contact Pattern of Controlled Geometry";

5) U.S. patent application Ser. No. 08/802,054, filed Feb. 18, 1997, titled "Microelectronic Contact Structure, and Method of Making Same";

6) U.S. patent application Ser. No. 09/473,414, filed Dec. 28, 1999, titled "Interconnect for Microelectronic Structures with Enhanced Spring Characteristics";

7) U.S. patent application Ser. No. 09/547,561, filed Apr. 12, 2000, titled "Shaped Spring";

8) U.S. patent application Ser. No. 09/547,560, filed Apr. 12, 2000, titled "Methods of Fabricating and Using Shaped Springs".

Figure 2:
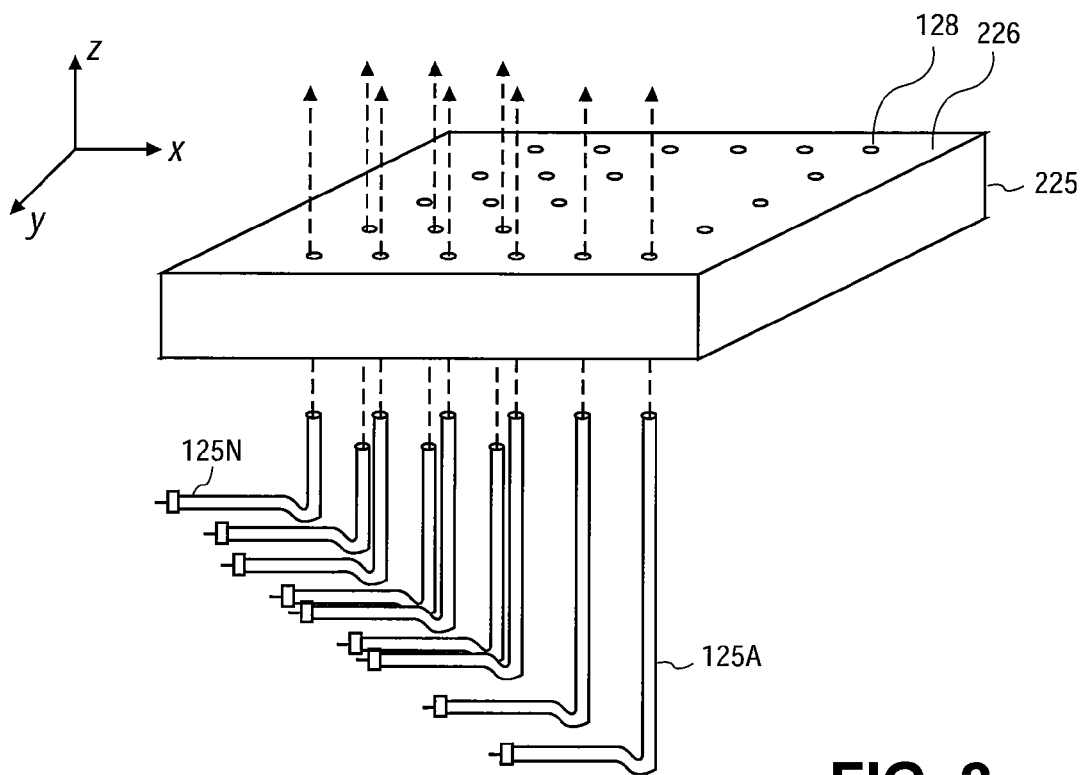
FIG. 2 shows a schematic, top perspective exploded view of a portion of the cable interface of FIG. 1.

Referring to FIG. 2, a second plurality of contact points of cables 125A . . . 125N of cable interface 120 are at second ends of cables and may each have conventional connectors, such as British Naval Connectors (BNCs) for coaxial cables, suitable for coupling to an electronic component such as a processor. Alternatively, the second plurality of contact points may be assembled in a second interface or interfaces, such as one or more sockets, for connection to a second electronic component. These ends may also be connected to a second component of the type shown in FIG. 1 (i.e., a second cable interface).

FIG. 2 shows an exploded view of a portion of cable interface 120. In this example, cable interface 120 includes first substrate body 225 that is a solid substrate of, for example, a fiberglass, ceramic, polymer, or conductive material. In one embodiment, first substrate body 225 has a thickness suitable for maintaining the rigidity of cable interface 120. In use in integrated circuit device testing, issues such as the planarity of the first contact points are significant and therefore the body of cable interface 120 should be able to demonstrate a suitable stiffness or rigidity for such use. A thickness on the order of a few hundred mils of a fiberglass, ceramic, or certain polymer materials or metals will suffice for most device testing operations.

In the illustrated embodiment, first substrate body 225 is approximately rectangular or square having X-Y dimensions similar to an interposer or space transformer to which it may be, in one embodiment, coupled. Alternatively, first substrate body 225 may be circular or of another shape as the dimensions of the application may dictate. The dimensions are also selected to be suitable to house the desired number of cables 125A . . . 125N for the interfacing operation given the outside diameter of the selected cable. In use as a component of an integrated circuit testing device, for example, it may be desired to have 1,000 contact points for a logic tester and 3,000 contact points for a memory tester. Suitably sized single-conductor cables having outside diameters on the order of 62.5 mils (1.5 mm) to 31.2 mils (0.75 mm) may be accommodated on a square substrate of 3 inches by 3 inches (7.6 cm by 7.6 cm) and provide a sufficient number of conductors to accommodate those contact points. Alternatively, a large array may be assembled from sub-assemblies, each with a smaller number of cables that are fitted together (e.g., mechanically coupled) to form a large array.

As shown in FIG. 2, first substrate body 225 has a plurality of Z-direction through holes 128 formed therethrough. Through holes 128 locate cables 125A . . . 125N in an X-Y plane according to the desired contact alignment for the interface structure. In one embodiment, through holes 128 are machine-drilled through the solid substrate material of first substrate body 225 to the desired alignment. Through holes 128 are sized to accommodate cables 125A . . . 125N such that cables 125A . . . 125N extend through first substrate body 225.

Figure 3:
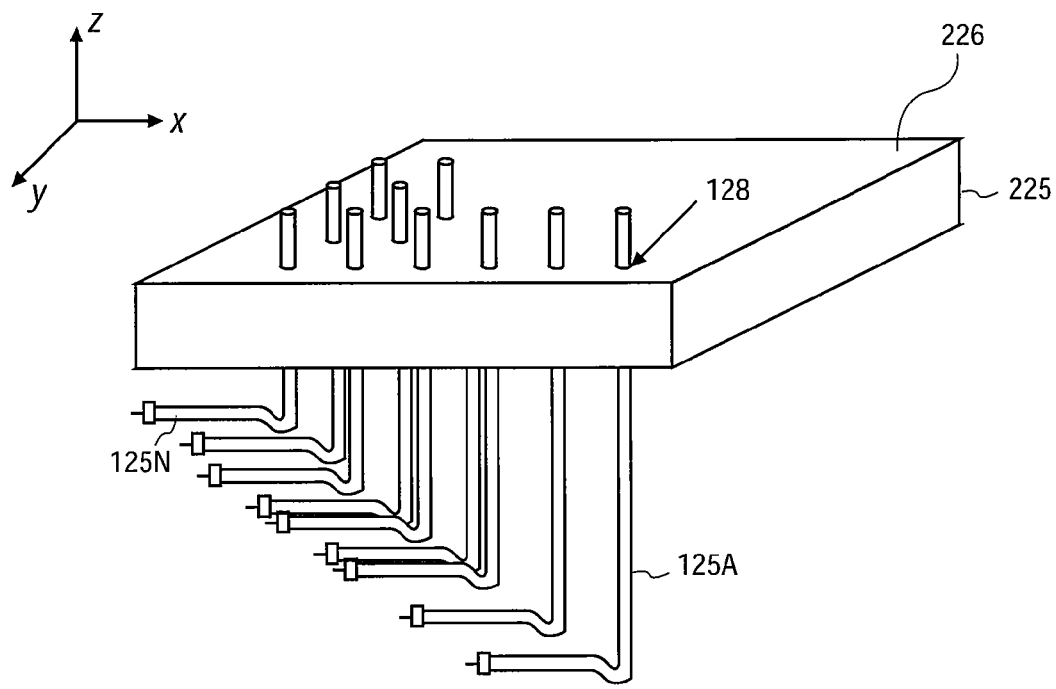
FIG. 3 shows a schematic, top perspective view of a portion of the cable interface of FIG. 1 with cables fitted in through holes through a first substrate body.

FIG. 3 shows the structure of FIG. 2 after the insertion of cables 125A . . . 125N through through holes 128 in first substrate body 225. In this embodiment, cables 125A . . . 125N are fitted in such a way that their end portions extend beyond superior surface 226 of first substrate body 225.

Figure 4:
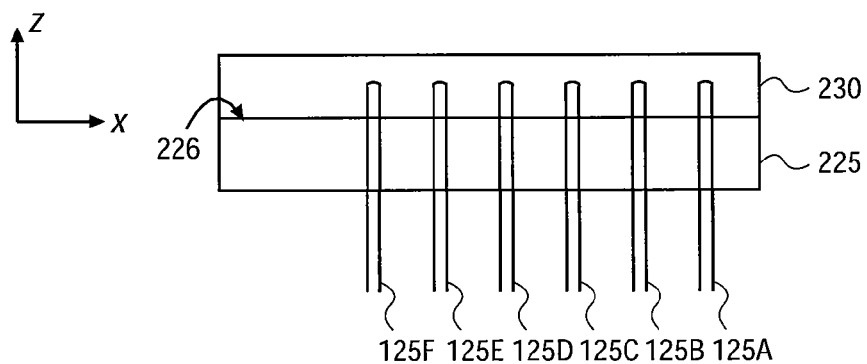
FIG. 4 shows a schematic side view of the cable interface of FIG. 1 after introducing a material to form a second substrate body over ends of the cables extending through the first substrate body.

Following the introduction of cables 125A . . . 125N through through holes 128 and above superior surface 226 of first substrate body 225, first substrate body 225 and fitted cables 125A . . . 125N are potted or overfilled with, in one embodiment, a suitable dielectric material, as second substrate body 230 as shown in FIG. 4. In one embodiment, second substrate body 230 is selected such that it may be introduced by flowing over superior surface 226 of first substrate body 225 and then cured to form a solid structure, such as by thermal or radiation curing means as known in the art. Polymers such as certain polyimides or epoxies are suitable for such potting. A thickness of second substrate body 230, in one embodiment, is determined by that amount necessary to encapsulate or overfill (in a Z-direction) protruding ends of cables 125A . . . 125N.

Following the introduction and curing of second substrate body 230 over first substrate body 225, the structure is planarized or lapped in an X-Y plane in such a manner to expose ends of previously encapsulated cables 125A . . . 125N. Suitable planarization techniques include, but are not limited to, etching or chemical and/or mechanical polishing as known in the art.

Figure 5:
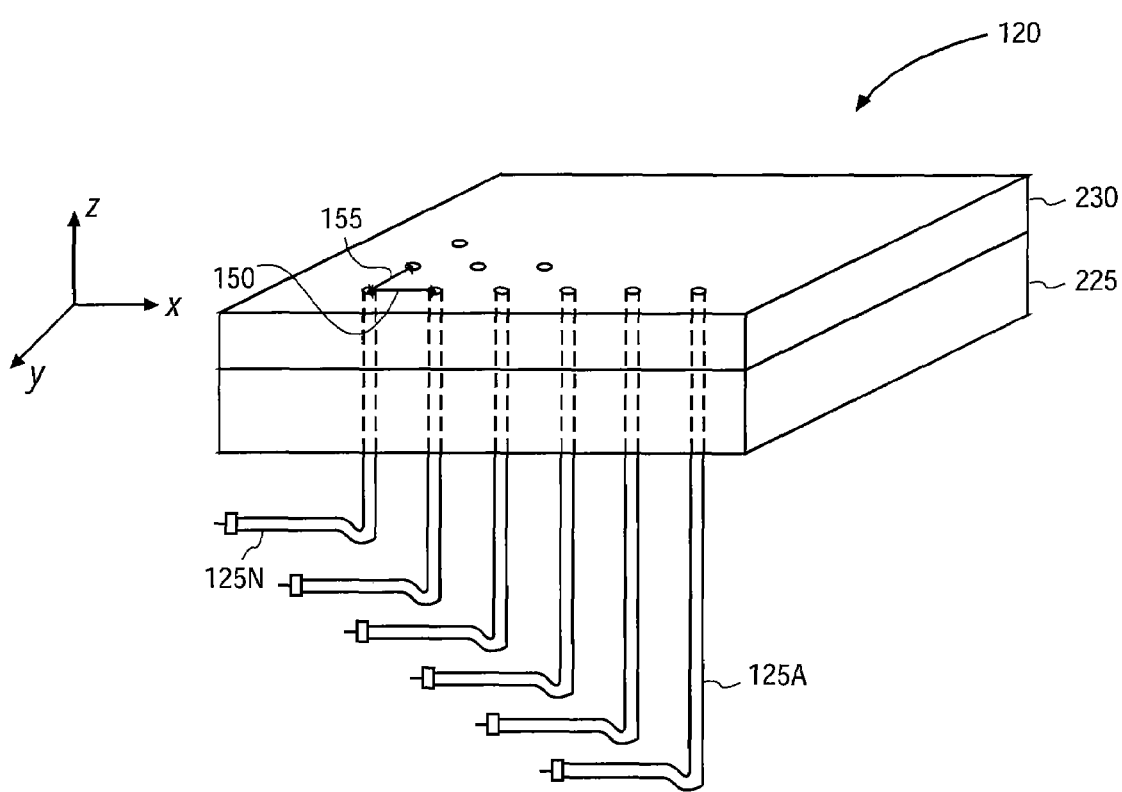
FIG. 5 shows a schematic, top perspective view of the structure of FIG. 4 after lapping or planarizing the second substrate body to expose conductors of the cables.

FIG. 5 shows cable interface 120 following the planarization or lapping of second substrate body 230 to expose ends of cables 125A . . . 125N conductors of cables 125A . . . 125N such that conductors are available for contact according to a pre-selected orientation. In the case of cables of wires, such as copper wires, the wire itself is the conductor. In the case of coaxial cables, such cables typically include two conductors with a solid central conductor surrounded by an insulator, which is in turn surrounded by a cylindrical shield woven from fine wires. In such case, after planarization or lapping, both the central conductor and the shield are available for electrical contact. It is appreciated that any jacketing on the cable, for example, surrounding the shield of a coaxial cable, is removed at the ends during the planarization or lapping to expose the shield.

FIG. 5 shows cables 125A . . . 125N disposed at a predetermined pitch for contact between the cable ends of cable interface 120 and electronic component. In FIG. 5, the X-direction pitch is represented by reference numeral 150 and a Y-direction pitch by reference numeral 155. A suitable pitch for coupling to current state of art electronic components through the use of interconnection elements, is on the order of 50 mils (1.3 mm) to 100 mils (2.5 mm). The use of the interconnection elements mentioned, however, would allow even finer pitches to be used (e.g., <200 µm). In FIG. 5, X-direction pitch 150 and the Y-direction pitch 155 is defined between the center of adjacent conductors.

Figure 6:
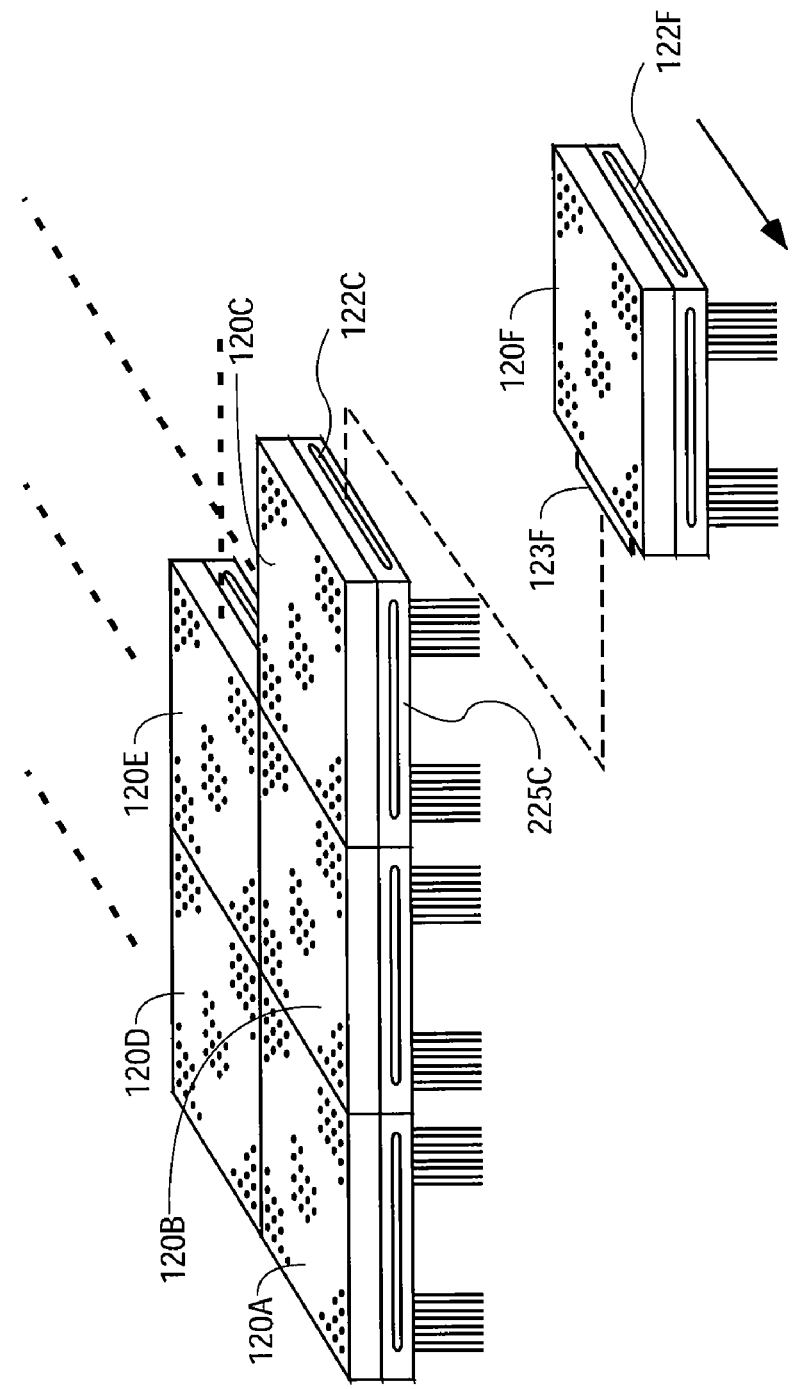
FIG. 6 shows a schematic, top perspective view of a plurality of cable interface sub assemblies arranged in an array.

FIG. 6 shows an example of a plurality of cable interfaces as sub-assemblies coupled together to form a single array. Such an array of sub-assemblies can be used to accommodate a large number of contact points to which the sub-assemblies interface. Referring to FIG. 6, cable interfaces 120A, 120B, 120C, 120D, and 120E are mechanically coupled together in a large array. One type of mechanical coupling is force-fitting male and female components of respective cable-interface sub-assemblies together. FIG. 6 shows cable interface 120C having female connector 122C (in this example, a slot formed in first substrate body 225C). A male connector, such as male connector 123F of cable interface 120F is sized to fit (mate) with female connector 122C in a pressure-fit, decouable relationship. Cable interface 120F also includes one or more female connectors, such as female connectors 122F and 124F.

It is appreciated that the cable interfaces of an array such as shown in FIG. 6 may be configured of various dimensions (e.g., they may all be of similar rectangular dimensions or different rectangular dimensions or other geometric configurations). The cable interfaces of an array may also be of similar or varying thickness. Finally, when assembled in an array, the cables of individual cable interfaces may be used for different purposes. For example, the cables of cable interface 120A may function as signal lines for a particular application while the cables of cable interface 120B may function as supply (power) or return (ground) lines for the same application.

Figure 7:
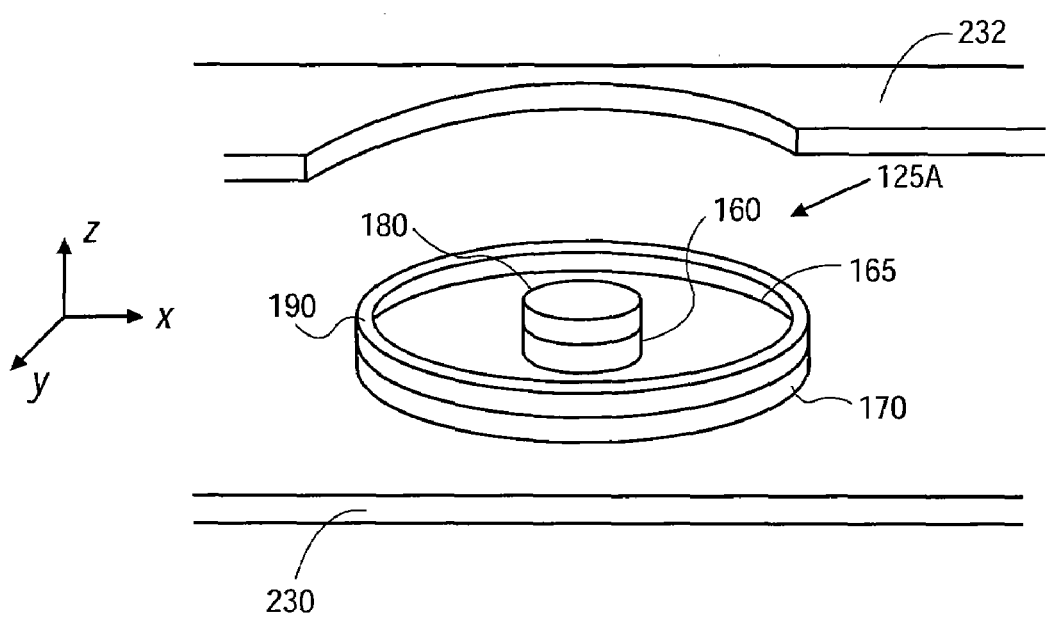
FIG. 7 shows a schematic, top perspective view of a single exposed cable end through a cable interface body having a coating introduced on conductors of the cable.

FIG. 7 shows an isolated close-up view of an end of cable 125A exposed after planarization or lapping through second substrate body 230. In this top perspective view, a portion of second substrate body 230 is cut away, exposing cable 125A below surface 232 of second substrate body 230. In this embodiment, cable 125A is a coaxial cable comprising solid central conductor 160 of, for example, a copper material. Central conductor 160 is surrounded by insulator or dielectric material 165 of, for example, polyethylene or TEFLON®. Surrounding insulator or dielectric material 165 is shield 170 of, for example, woven copper wires. Coaxial cables are selected, in one embodiment, as a suitable signal transmission line because of their generally constant-impedance property. Another advantage of coaxial cables is that shield 170 may be used as a supply/return line for central conductor 160, such as a line to ground.

As noted above, in one embodiment, central conductor 160 and shield 170 may serve as contact points for contact with an electronic component. Alternatively, and in the embodiment shown, central conductor 160 and shield 170 are coated on the exposed surface by a conductive material. In one embodiment, the conductive material selected as a coating for central conductor 160 and shield 170 is a durable, inert material that resists oxidation. A suitable material is, for example, gold (Au). In the case of gold, the conductive material may be coated over central conductor 160 and shield 170 by an electroplating process. By way of example, an electroplating process involves introducing metallic ions, such as gold ions, in a pH neutral-base solution, and reducing the ions to a metallic state by applying current between central conductor 160 and/or shield 170 and an anode of an electroplating cell in the presence of the solution. It should be appreciated that nonconducting electroless plating deposition may also be used for coating.

FIG. 7 shows central conductor 160 having conductor material 180 introduced thereon. Similarly, FIG. 7 shows shield 170 having conductor material 190 introduced thereon. In the case of an electroplating process, the coating of conductor materials 180 and 190 (of similar materials) may be done simultaneously. In one embodiment, conductor materials 180 and 190 have a thickness on the order of a few mils or a sufficient amount to, in one embodiment, protect central conductor 160 and shield 170 from oxidation. In one embodiment, the conductors are planarly aligned about surface 232 of second substrate body 230 (i.e., coated conductors may extend a few mils above the surface of second substrate body 230).

Figure 8:
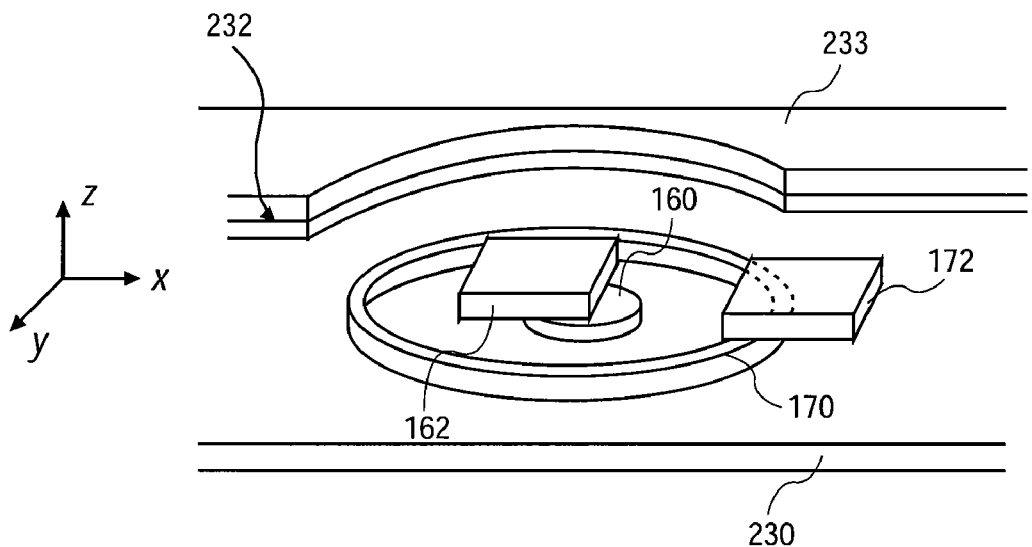
FIG. 8 shows a schematic, top perspective view of a single exposed cable end through a cable interface body in a first embodiment where contact Fads are coupled to conductors of the cable and planarly arranged on the surface of the interface body.

In another embodiment, conductive pads may be coupled to central conductor 160 and shield 170. FIG. 8 shows an embodiment where contact points or pads 162 and 172 are coupled to central conductor 160 and shield 170, respectively. In this manner, surface 232 of cable interface 120 comprises a plurality of pads arranged at a corresponding pitch for coupling to an electronic component. Contact points or pads 162 and 172, may be introduced as a conductive sheet (e.g., laminated to surface 232 of second substrate body 230) and patterned into contact pads. Alternatively, the contact pads may be introduced by depositing conductive material as a blanket over surface 232 and patterning the conductive material into corresponding contact pads using, for example, lithographic techniques. Once patterned, the contact pads may be over coated such as described above with a material that resists oxidation such as gold. A dielectric material layer, such as a solder masking material layer, may be introduced over surface 232 and surrounding contact points or pads 162 and 172 so that only the contact pads are exposed on surface 232. In this perspective view, a portion of second substrate body 230 is cut away, exposing cable 125A below dielectric material layer 233 on surface 232 of second substrate body 230.

Figure 9:
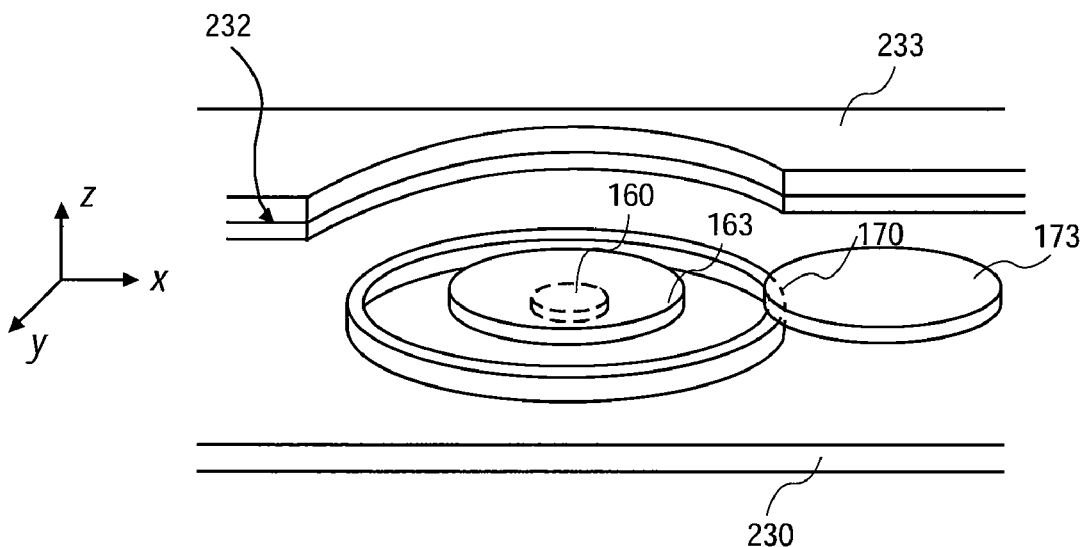
FIG. 9 shows a schematic, top perspective view of a single exposed cable end through a cable interface body in a second embodiment where contact pads are coupled to conductors of the cable and planarly arranged on the surface of the interface body.

FIG. 9 shows an embodiment where contact points or pads 163 and 173 are coupled to central conductor 160 and shield 170, respectively, according to another configuration. In this embodiment, contact point or pad 163 completely overlies central conductor 160 and contact point or pad 173 overlies a portion of shield 170. The introduction (e.g., deposition) and patterning of contact points or pads 163 and 173 may be similar to the introduction described above with reference to FIG. 8 and the accompanying text. Also similar to the embodiment described with reference to FIG. 8, dielectric material layer 233 may be introduced over surface 232 around the contact points or pads.

Figure 10:
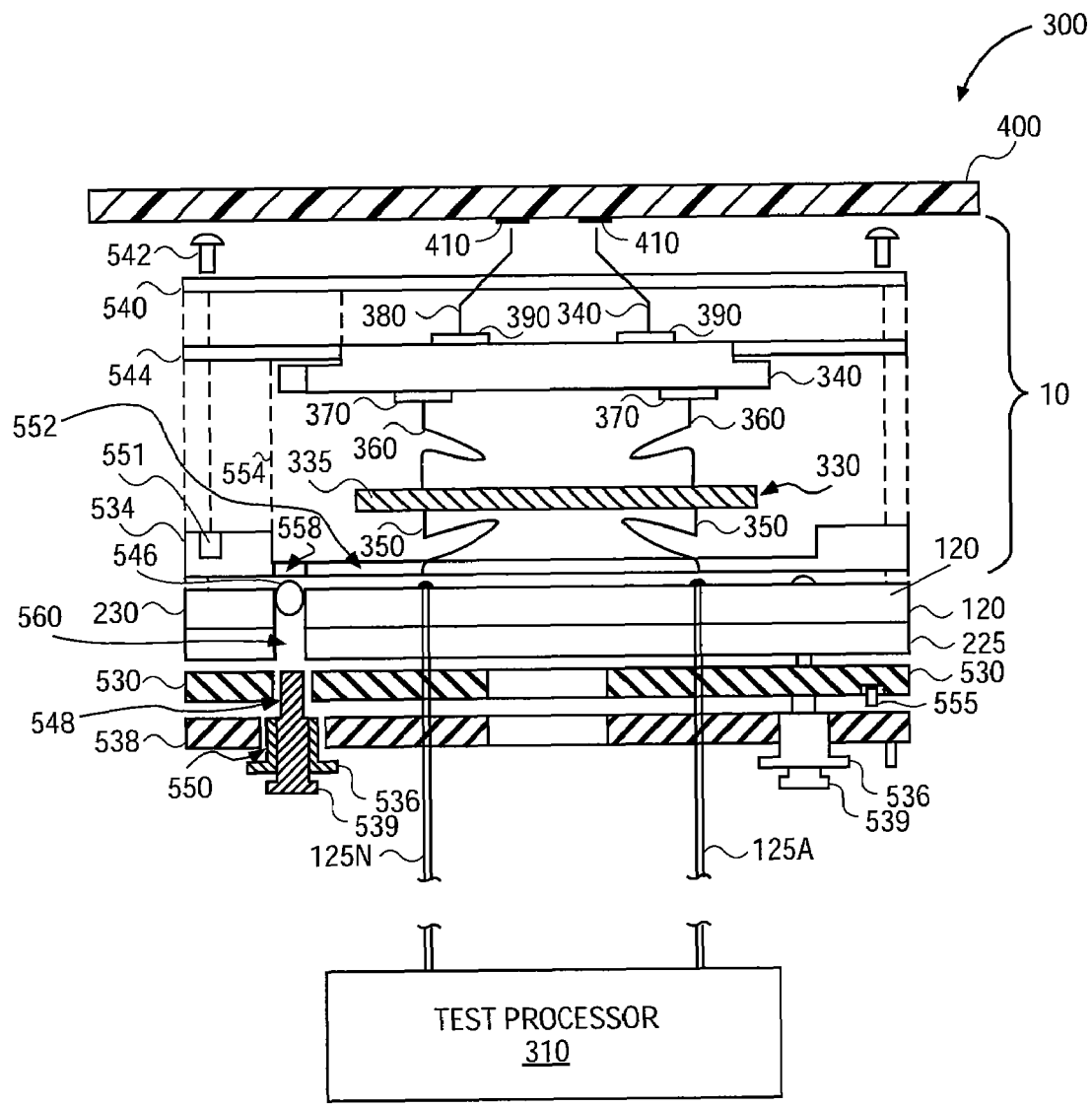
FIG. 10 shows a schematic, exploded, cross-sectional view of one embodiment of a testing system.

FIG. 10 shows a representative application of cable interface 120. FIG. 10 illustrates a test assembly according to one embodiment. Test assembly 300 includes as its major functional components, test processor 310, cable interface 120, interposer 330, and space transformer 340. In this embodiment, test assembly 300 is suitable for use in making temporary interconnections or contacts to a wafer, such as wafer 400 having integrated devices (dies) thereon. In this exploded, cross-sectional view, certain elements of various components are shown exaggerated for illustrative clarity. The vertical (as shown) alignment of the various components is, however, properly indicated by the dash lines in the figure. The components referenced by bracket 10 are described in conjunction with a probe card assembly detailed in U.S. Pat. No. 5,974,662 issued Nov. 2, 1999, titled "Method of Planarizing Tips of Probe Elements of a Probe Card Assembly, and its counterpart application, U.S. patent application Ser. No. 09/156,957, filed Sep. 18, 1998, each incorporated herein by reference.

Referring to the component parts of test assembly 300, interposer 330 includes, in this embodiment, substrate 335 having a plurality of resilient interconnection elements 350 (two of many shown) mounted to and extending downward (as viewed) from the bottom surface of substrate 335. Substrate 335 also includes a corresponding plurality of interconnection elements 360 (two of many) mounted to and extending upward (as viewed) from the top surface of substrate 335. Interconnection elements 360 and 350 are, for example, resilient interconnection elements of any of the spring shapes referenced in the aforementioned patent and application. Suitable alternative interconnection elements also include, but are not limited to, those interconnection elements referenced above in connection with FIG. 1 and the accompanying text.

Interposer 330 provides dimensional stability to test assembly 300 by adjusting the planarity of the assembly to improve the electrical contact between the test assembly and wafer 400. Generally, the height of the interconnection elements is dictated by the amount of compliance desired. The interconnection elements may have a representative overall height of about 20 to about 100 mils from respective bottom and top surfaces of substrate 335. Typically, interconnection elements 350 and interconnection elements 360 are at a pitch that matches a pitch of a typical prior art probe card, e.g., 100 mils.

Figure 11:
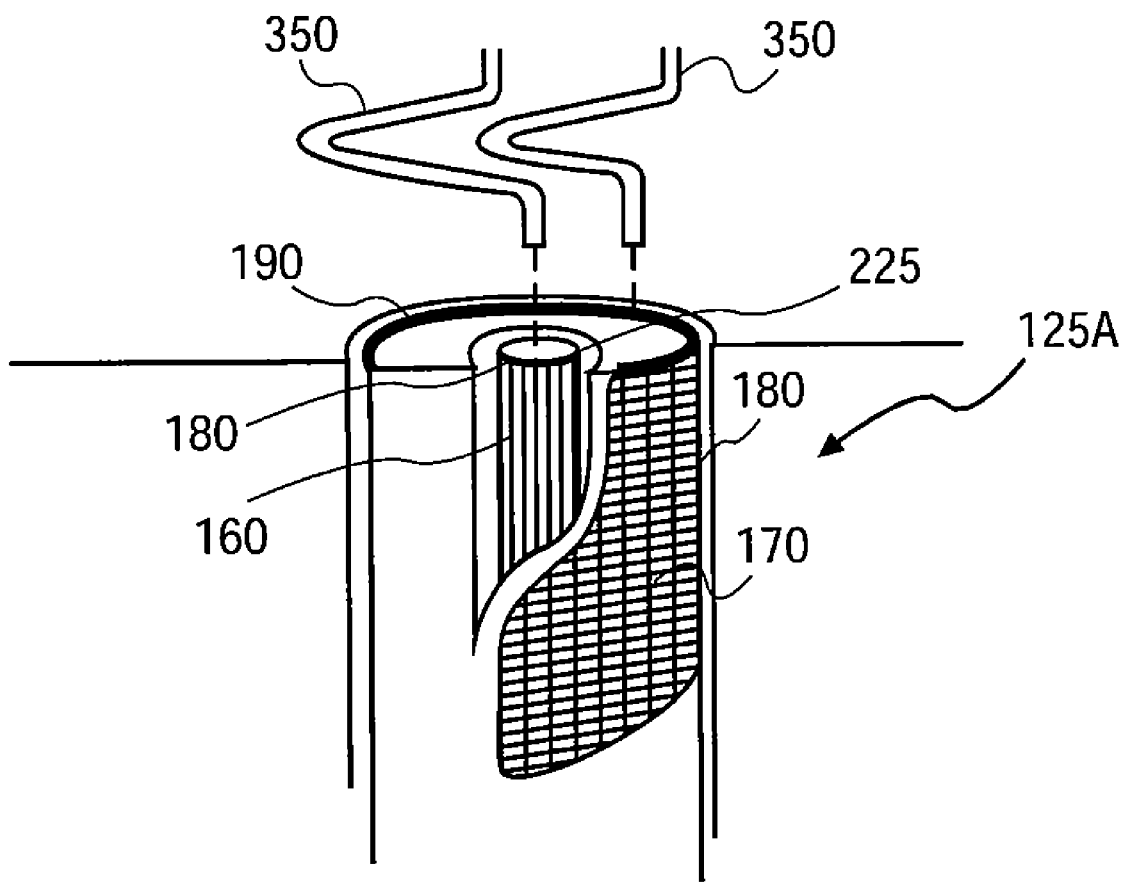
FIG. 11 shows a schematic perspective and partial cross-sectional view of a single coaxial cable of a cable interface suitable for use in the testing system of FIG. 10.

In the assembly shown, the wiring interconnect layers in the probe card are replaced by cable interface 120. Accordingly, cable interface 120 includes a sufficient number of cables 125A . . . 125N (two of many shown) with conductors disposed at a pitch selected, in one embodiment, to correspond with the pitch of interposer 330. Accordingly, if interposer 330 has 1000 interconnection elements disposed at a 100 mil pitch (e.g., X- and Y-direction pitch of 100 mil) cable interface 120 has a corresponding number of contact points (conductors) aligned in a similar fashion with a similar 100 mil pitch. Such contact points may be for signals and supply (power) and return (ground) lines, either or both. FIG. 11 shows a representative alignment of two interconnection elements 350 to central conductor 160 and shield 170 of cable (e.g., a coaxial cable) 125A.

As shown in FIG. 10 and FIG. 11, interconnection elements 350 of interposer 330 make temporary pressure connections with conductors of cable interface 120. One alternative to this configuration is to provide cable interface 120 with relatively permanent interconnection elements (e.g., interconnection elements 350 bonded to conductors of cable interface 120) having ends extending from the upper (as viewed) surface of cable interface 120 and making temporary pressure connections with contact points (e.g., terminals) on interposer 330. Alternatively, the interposer itself could be eliminated, and resilient contacts on either space transformer 340 or cable interface 120 could interface directly to pads on the other surface.

Referring to FIG. 10, space transformer 340 includes, in one embodiment, a suitable circuitized substrate 345, such as a multi-layer ceramic substrate, having a plurality of terminals 370 (two of many shown) disposed on the lower (as viewed) surface thereof and a plurality of terminals 390 (two of many shown) disposed on the upper (as viewed) surface thereof. In this example, the lower plurality of terminals 370 are disposed at the pitch of the tips of interconnection elements 360 (e.g., 100 mils), and the upper plurality of terminals 390 are disposed at a finer (closer) pitch (e.g., 50 mils).

Plurality of interconnection elements 380 (two of many shown), e.g., resilient interconnection elements referenced above, are mounted to terminals 390 of space transformer 340 and extend upward (as viewed) from the top surface of space transformer 340. As illustrated, interconnection elements 380 are suitably arranged so that their tips (distal ends) are spaced at an even finer pitch (e.g., 10 mils) than their bases (e.g., proximal ends) to contact, for example, contact points 410 (e.g., bond pads) on dies of wafer 400.

In use, interposer 330 is disposed on the top (as viewed) surface of cable interface 120, and is within sufficient proximity so that interconnection elements 350 make a reliable pressure contact with contact points of cable interface 120. Similarly, space transformer 140 is stacked atop (as viewed) interposer 130 within sufficient proximity so that interconnection elements 360 make a reliable pressure contact with terminals 370 at space transformer 140. Any suitable mechanism for stacking these components and for maintaining such reliable pressure contacts maybe employed.

In one embodiment, the stacking of the components of test assembly 300 is similar to that described in U.S. Pat. No. 5,974,662, incorporated herein by reference. A brief description of a representative stacking is presented as follows.

Test assembly 300 includes the following major components for stacking interposer 330, space transformer 340, and cable interface 120:

rear mounting plate 530 made of a rigid material such as stainless steel;

actuator mounting plate 538 made of a rigid material such as stainless steel;

front mounting plate 534 made of a rigid material such as stainless steel;

a plurality (two of possibly many shown, three is preferred) of differential screws including outer differential screw element 536 and an inner differential screw element 539;

mounting ring 540 which is preferably made of a springly material such as phosphor bronze and which has a pattern of springy tabs (not shown) extending therefrom;

plurality (two of many shown) of screws 542 for holding mounting ring 540 to front mounting plate 534 with space transformer 340 captured therebetween;

optionally, spacer ring 544 disposed between mounting ring 540 and space transformer 340 to accommodate manufacturing tolerances; and plurality (two of many shown) of pivot spheres 546 disposed atop (as viewed) the differential screws (e.g., atop inner differential screw element 539).

Rear mounting plate 530 is a plate or ring (shown as a ring) disposed on the bottom (as shown) surface of the body of cable interface 120. A plurality (one of many shown) of holes 548 extend through the rear mounting plate 530.

Actuator mounting plate 538 is a plate or ring (shown as a ring) disposed on the bottom (as shown) surface of rear mounting plate 530. Plurality (one of many shown) of holes 550 extend through actuator mounting plate 538. In use, actuator mounting plate 538 is affixed to rear mounting plate 530 in any suitable manner, such as with screws (omitted from the figure for illustrative clarity).

Front mounting plate 534 is a rigid, preferably metal ring. In use, front mounting plate 534 is affixed to rear mounting plate 530 in any suitable manner, such as with screws (omitted from the figure for illustrative clarity) extending through corresponding holes (omitted from the figure for illustrative clarity) through the body of cable interface 120, thereby capturing cable interface 120 securely between front mounting plate 534 and rear mounting plate 530.

Front mounting plate 534 has a flat bottom (as viewed) surface disposed against the top (as viewed) surface of the body of cable interface 120. Front mounting plate 534 has a large central opening therethrough, defined by inner edge 552 thereof, which is sized to permit the plurality of conductors (e.g., contact terminals) of cable interface 120 to reside within the central opening of front mounting plate 534, as shown.

As mentioned, front mounting plate 534 is a ring-like structure having a flat bottom (as viewed) surface. The top (as viewed) surface of front mounting plat 534 is stepped, front mounting plate 534 being thicker (vertical extent, as viewed) in an outer region thereof than in an inner region thereof. The step, or shoulder is located at the position of the dashed line (labeled 554), and is sized to permit space transformer 340 to clear the outer region of the front mounting plate and rest upon the inner region of front mounting plate 534 (although, the space transformer actually rests upon pivot spheres 546).

Plurality (one of many shown) of holes 551 extend into the outer region of front mounting plate 534 from the top (as viewed) surface thereof at least partially through front mounting plate 534 (these holes are shown extending only partially through front mounting plate 534 in the figure) which receive the ends of a corresponding plurality of screws 542. To this end, holes 551 are threaded holes. This permits space transformer 340 to be secured to the front mounting plate by mounting ring 540, hence urged against the body of cable interface 120.

A plurality (one of many shown) of holes 558 extend completely through the thinner, inner region of front mounting plate 534, and are aligned with a plurality (one of many shown) of corresponding holes 560 extending through the body of cable interface 120 which, inturn, are aligned with holes 548 in the rear mounting plate 530 and holes 550 in actuator mounting plate 538.

Pivot spheres 546 are loosely disposed within aligned holes 558 and 560, at the top (as viewed) end of the inner differential screw elements 539. Outer differential screw elements 536 thread into (threaded) holes 550 of actuator mounting plate 538, and inner differential screw elements 539 thread into a threaded bore of outer differential screw elements 536. In this manner, very fine adjustments can be made in the positions of the individual pivot spheres 546. For example, outer differential screw elements 536 have an external thread of 72 threads-per-inch, and inner differential screw elements 539 have an external thread of 80 threads-per-inch. By advancing an outer differential screw element one turn into actuator mounting plate 538 and by holding the corresponding inner differential screw element 539 stationary (with respect to actuator mounting plate 538), the net change in the position of the corresponding pivot spheres 546 will be 'plus' $\frac{1}{72}$ (0.0139) 'minus' $\frac{1}{80}$ (0.0125) inches, or 0.0014 inches (0.003 cm). This permits facile and precise adjustment of the planarity of space transformer 340 vis-a-vis cable interface 120. Hence, the positions of the tips (top ends, as viewed) of interconnection elements 380 can be changed, without changing the orientation of cable interface 120 relative to the assembly. Interposer 330 ensures that electrical connections are maintained between space transformer 340 and cable interface 120 throughout the space transformer's range of adjustment, by virtue of the resilient or compliant interconnection elements disposed on the two surfaces of the interposer.

Conventional probe card assemblies route signals from terminals in the inner periphery of the probe card typically to terminals at an outer periphery of the probe card by conductive traces through the probe card substrate. These outer terminals are generally electrically coupled to the test processor through conductive pogo pins extending between the probe card and a test head. The pogo pins are then electrically coupled to coaxial cables in a cable matrix that is coupled to a test processor. In the embodiment shown in FIG. 10, the probe card and conductive pogo pins are eliminated. Instead, cables 125A . . . 125N from cable interface 120 are coupled directly via interposer 330 and to test processor 310. In FIG. 10, the cables (e.g., a cable matrix) may extend from the bottom surface (as shown) of first substrate body 225 through openings in rear mounting plate 530 and actuator mounting plate 538 (e.g., annular openings of ring structures) to couple with test processor 310.

Figure 12:
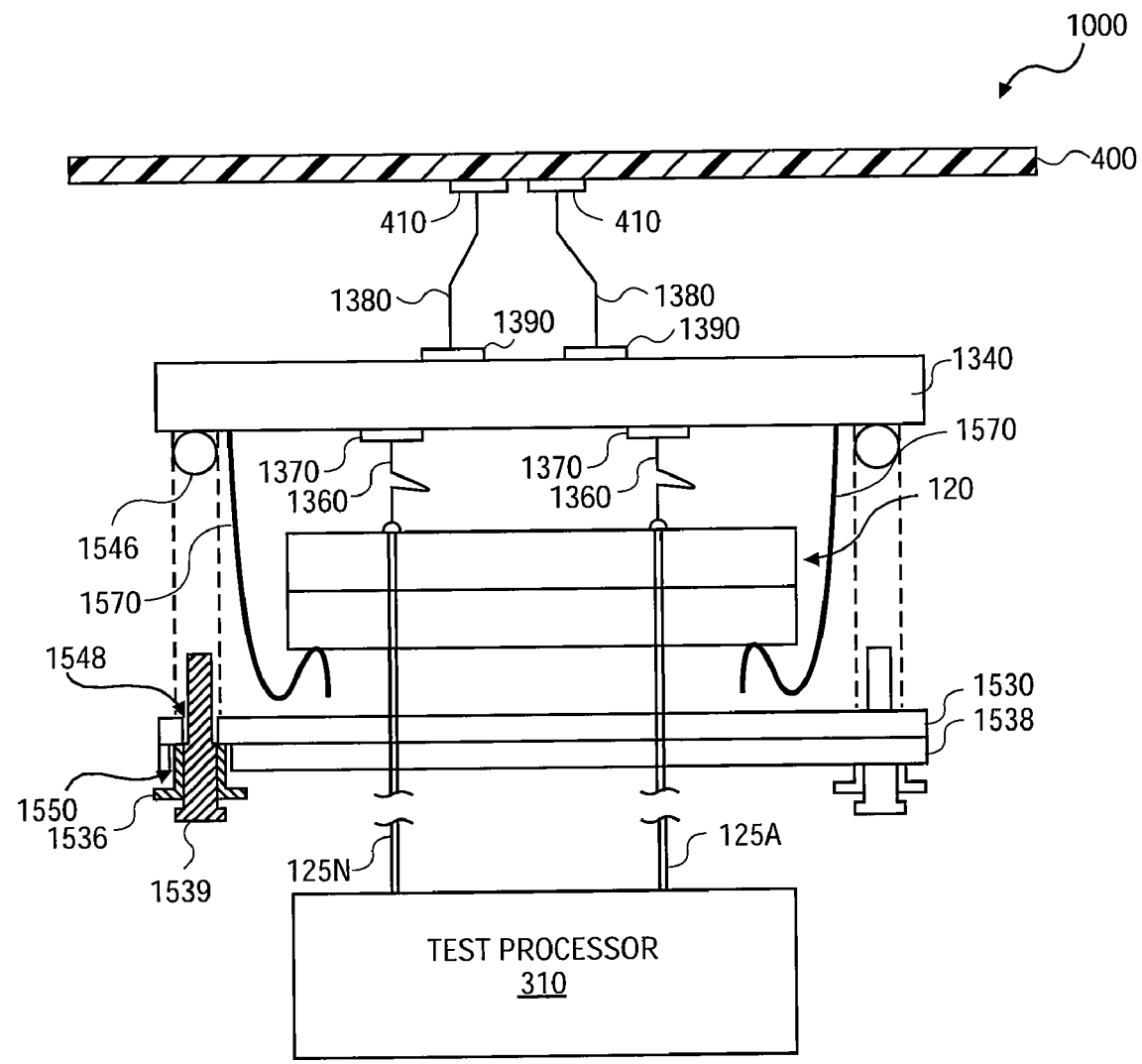
FIG. 12 shows a schematic cross-sectional side view of a second embodiment of a testing system.

It is to be appreciated that the test assembly illustrated in FIG. 10 is one example of a suitable assembly (test assembly 300) utilizing a cable interface. One alternative would be to couple the cable interface (e.g., cable interface 120) directly to the space transformer (e.g., space transformer 340) without incorporating an interposer. FIG. 12 illustrates a representative configuration.

FIG. 12 shows test assembly 1000 including test processor 310, cable interface 120 and space transformer 1340. In this embodiment, test assembly 1000 is suitable for use in making temporary interconnections or contacts to a wafer such as wafer 400 having integrated devices (dies) thereon.

Referring to the components of test assembly 1000, cable interface 120 includes a sufficient number of cables 125A . . . 125N (two of possibly many shown) with conductors exposed at the surface of the interface body at a pitch selected, in one embodiment, to correspond with a pitch of corresponding contacts on space transformer 1340 (e.g., contact points or pads 1370).

As shown in FIG. 12, interconnection elements 1360 are mounted to conductors of cable interface 120. Interconnection elements 1360 extend upward (as viewed) from the surface of cable interface 120. Interconnection elements 1360 are, for example, resilient interconnection elements of any of the spring shapes referenced in the aforementioned patent and application. Suitable alternative interconnection elements also include, but are not limited to, those interconnection elements referenced above in connection with FIG. 1 and the accompanying text.

Interconnection elements 1360 are coupled (relatively permanently connected) to conductors on cable interface 120 and make temporary electrical connections or couplings with contact points or pads 1370 of space transformer 1340. Alternatively, the situation may be reversed. Interconnection elements 1360 may be coupled (relatively permanently connected) to space transformer 1340 and make temporary electrical contact (coupling) with conductors of cable interface 120.

In the illustration shown in FIG. 12, space transformer 1340 of a suitable circuitized substrate also includes a plurality of terminals 1390 (two of possibly many shown) disposed on the upper (as viewed) surface thereof. In one example, the lower plurality of contact points or pads 1370 are disposed at the pitch of the tips of interconnection elements 1360 (e.g., 100 mils), and the upper plurality of terminals 1390 are disposed at a finer (closer) pitch (e.g., 50 mils).

Plurality of interconnection elements 1380, e.g., resilient interconnection elements such as referenced above, are mounted to terminals 1390 of space transformer 1340 and extend upward (as viewed) from the top surface of space transformer 1340. As illustrated, in one example, interconnection elements 1380 are suitably arranged so that their distal ends are spaced at an even finer pitch (e.g., 10 mils) than their bases (e.g., proximal ends) to contact contact points 410 (e.g., bond pads) on dies of wafer 400.

Unlike the test assembly shown in FIG. 10, test assembly 1000 in FIG. 12 does not include an interposer. Instead, space transformer 1340 is stacked atop (as viewed) cable interface 120 within sufficient proximity so that interconnection elements 1360 make a reliable pressure contact between contact points or pads 1370 of space transformer 1340 and conductors of cable interface 120. Any suitable mechanism for stacking these components and for maintaining reliable pressure contacts may be employed.

Referring to FIG. 12, test assembly 1000 includes space transformer 1340 and actuator mounting plate 1538 for stacking space transformer 1340 and cable interface 120. Rear mounting plate 1530 and actuator mounting plate 1538 are similar to similar components described above with reference to test assembly 300 in FIG. 10. In this case, rear mounting plate 1530 is a plate or ring disposed on the bottom (as shown) surface of the body of cable interface 120. A plurality of holes 1548 extend through rear mounting plate 1530. Actuator mounting plate 1538 is a plate or ring disposed on the bottom (as shown) surface of rear mounting plate 1530. A plurality of holes 1550 extend through actuator mounting plate 1538. Outer differential screw elements 1536 are threaded into holes 1550 of actuator mounting plate 1538, and inner differential screw elements 1539 are threaded into a threaded bore of outer differential screw elements 1536. The differential screw elements extend through aligned holes 1548 and 1550 and are adapted to contact pivot spheres 1546 loosely disposed against space transformer 1340. The differential screw elements allow facile and precise adjustment of the planarity of space transformer 1340 vis-a-vis cable interface 120. Hence, the position of the tip (distal end) of interconnection elements 1380 can be changed without changing the orientation of cable interface 120 with respect to space transformer 1340. Optional spring clips 1570 may further be included between space transformer 1340 and cable interface 120. Spring clips 1570, in this embodiment, permanently disposed on a surface (the bottom surface as shown) of space transformer 1340, extend substantially vertically to a surface (the bottom surface as shown) of cable interface 120 to further support the orientation between space transformer 1340 and cable interface 120.

Figure 13:
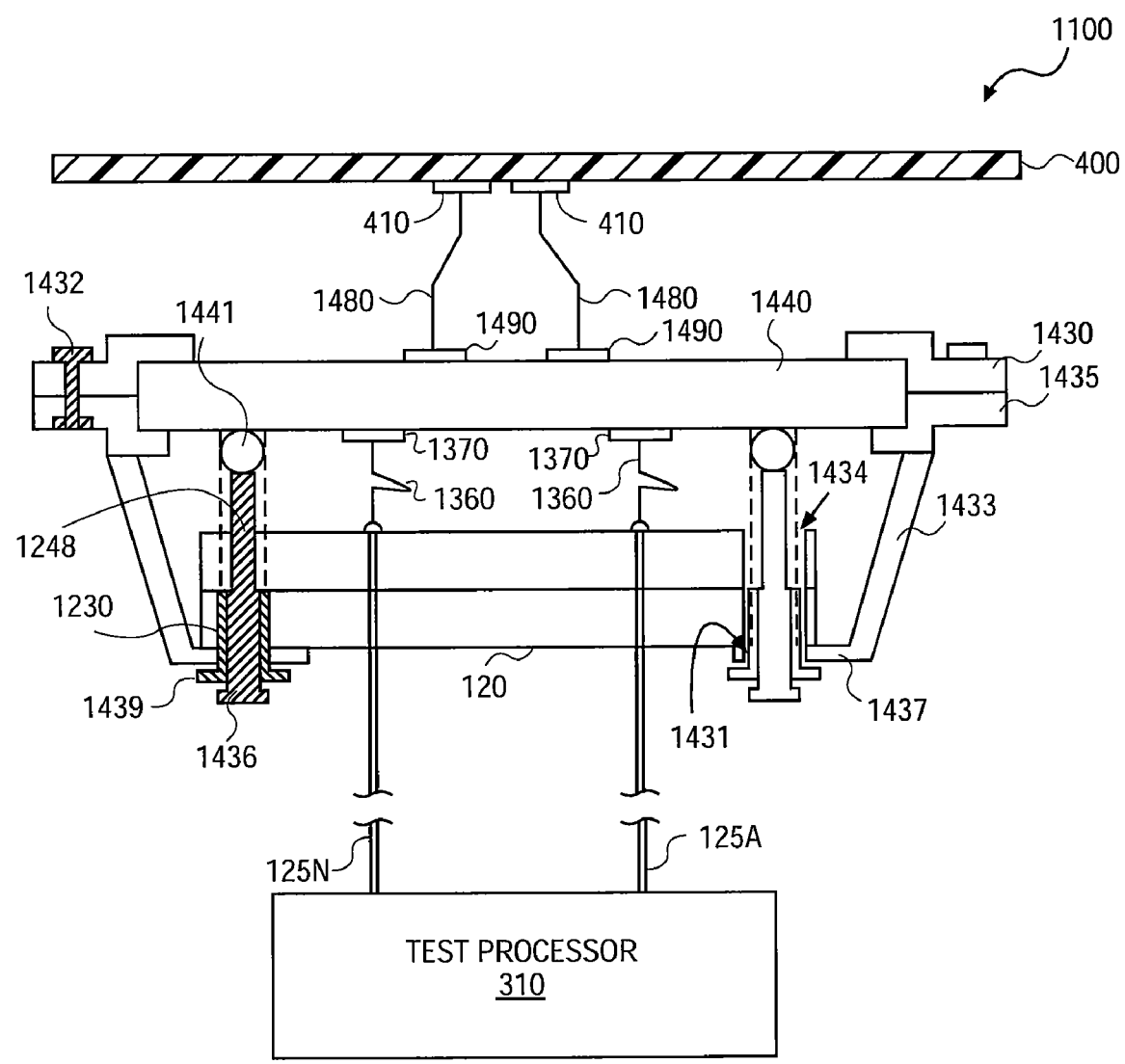
FIG. 13 shows a schematic cross-sectional side view of a third embodiment of a testing system.

FIG. 13 shows another embodiment of an assembly where the cable interface (e.g., cable interface 20) is coupled directly to the space transformer (e.g., space transformer 340) without incorporating an interposer. FIG. 13 shows test assembly 1100 including test processor 310, cable interface 120 and space transformer 1440.

Referring to the components of test assembly 1100, cable interface 120 includes a sufficient number of cables 125A ... 125N (two of possibly many shown) with conductors expend at the surface of the interface body at a pitch selected, in one embodiment, to correspond with a pitch of corresponding contacts on space transformer 1440 (e.g., contact points or pads 1470). Interconnection elements 1460 are mounted to conductors of cable interface 120 and extend upward (as viewed) from the surface of cable interface 120. Interconnection elements 1460 make temporary electrical connections with contact points or pads 1470 of space transformer 1440. Alternatively, the situation may be reversed with interconnection elements 1460 mounted on space transformer 1440 and making temporary electrical connections with conductors of cable interface 120.

Space transformer 1440 of a suitable circuitized substrate also includes a plurality of terminals 1490 (two of possibly many shown) disposed on the upper (as viewed) surface thereof. Interconnection elements, e.g., resilient interconnection elements, are mounted to terminals 1490 and extend upward to contact contact points 410 on dies of wafer 400.

Space transformer 1440 is stacked atop (as viewed) cable interface 120 so that interconnection elements 1460 make a reliable pressure contact between contact points or pads 1470 of space transformer 1440 and conductors of cable interface 120. The technique of stacking, in this example, includes top clamp plate 1435, bottom top plate 1435, and mounting brackets 1433. Top clamp plate 1430 is, for example, an annular ring or plate having an annular opening and a lip corresponding to as top edge (as viewed) of space transformer 1440. Bottom clamp plate 1435 is also a ring or plate having an annular opening and a lip corresponding to a bottom edge (as viewed) of space transformer 1440. As shown in FIG. 13, top clamp plate 1430 and bottom clamp plate 1435 may be brought together and fastened with, for example, screws 1432 to bind space transformer 1440. Mounting brackets 1433 extend downward (as viewed) from bottom mounting plate 1435 to horizontally disposed (as viewed) seat portions 1437 sized to accommodate cable interface 120.

In this embodiment, cable interface 120 includes openings 1434 extending through its body and aligned with openings 1431 in seat portions 1437. Differential screw elements 1436 and 1439 (similar to the differential screw elements described above with reference to FIG. 10 and the accompanying text) extend through aligned openings 1431 and 1434 and are adapted to contact pivot spheres 1441 loosely disposed against space transformer 1440.

Figure 14:
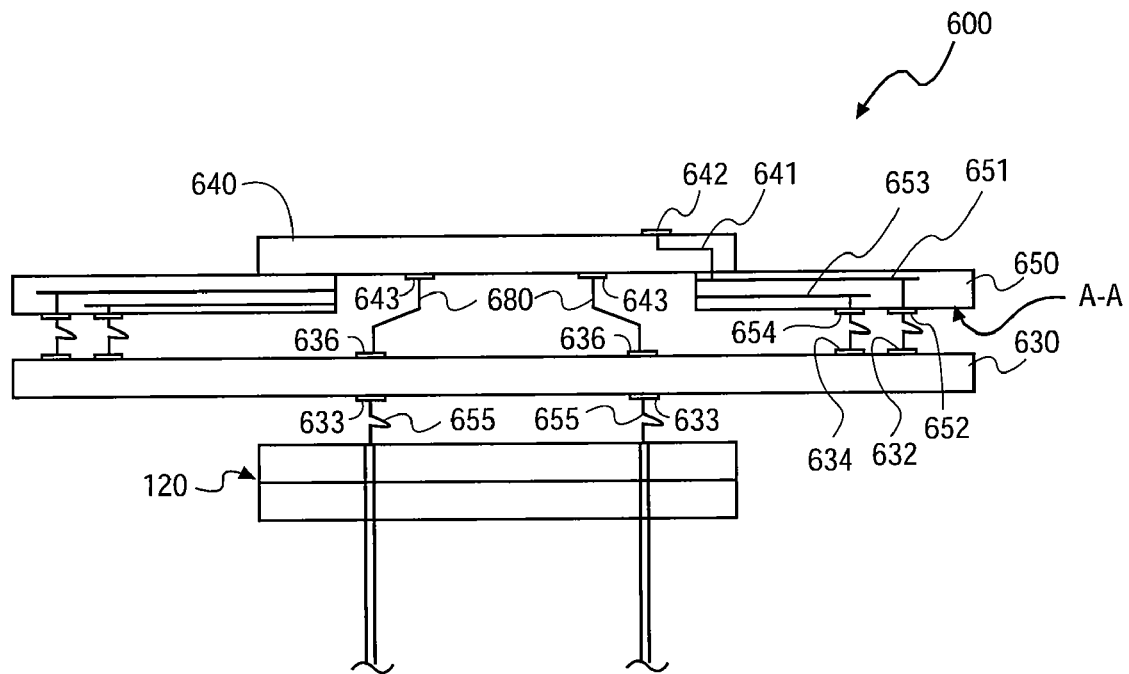
FIG. 14 shows a schematic cross-sectional side view of a fourth embodiment of a testing system.

Another test assembly is shown in the embodiment illustrated in FIG. 14. FIG. 14 shows test assembly 600 including space transformer 640, printed circuit board (PCB) 630, and cable interface 120. Test assembly 600 also includes supply substrate 650. Supply substrate 650 is, in this embodiment, coupled, through interconnection elements to PCB 630. Such an assembly might be used where, for example, cable interface 120 is insufficiently sized to accommodate sufficient conductors for coupling to an electronic component, such as wafer 400. Alternatively, such assembly might be used where it is desired to separate signals such as supply (power) and return (ground) from highspeed data signals.

In the embodiment shown in FIG. 14, cable interface 120 includes high-speed data signals 125A ... 125N and minimal (if any) power and ground lines. Additional electrical connections such as power and ground are carried by supply substrate 650 that is, for example, a flexible ring substrate surrounding space transformer 640.

Supply substrate 650, in one embodiment, is a multi-layer body having alternating layers of insulating material and conductive material. In FIG. 14, conductive layers 651 and 653 (two of possibly many shown) are shown. In this example, conductive layers carry signals such as power and ground. In one orientation of the conductive layers in supply substrate 650, the conductive layers alternate between power and ground layers, e.g., conductive layer 651 designated ground and conductive layer 653 designated power.

Figure 15:
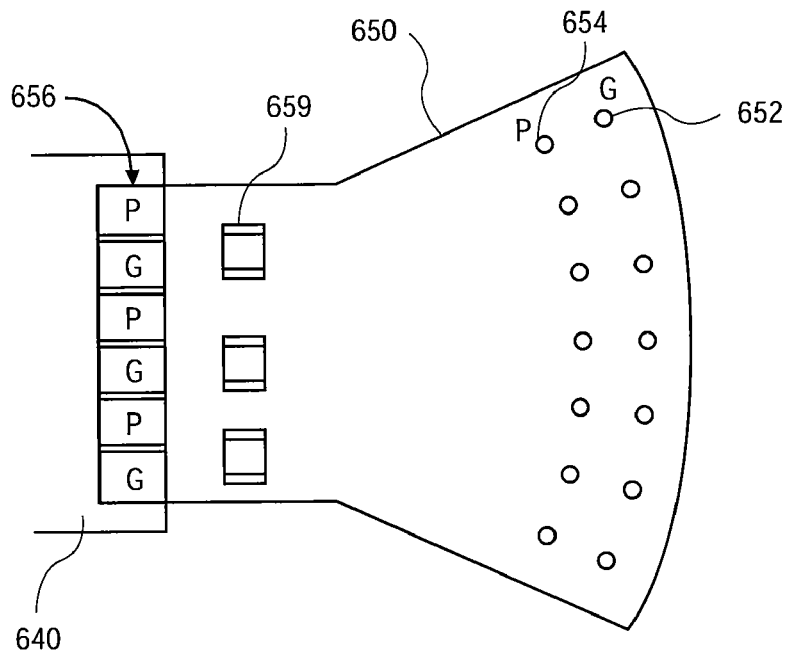
FIG. 15 shows a schematic top view of the portion of the testing system of FIG. 14.

FIG. 15 shows an underside view (as shown) of a portion of supply substrate 650, indicated in FIG. 14 by reference A-A. The surface of supply substrate 650 includes contact points or pads 652 and 654 and edge connectors 656. The surface of supply substrate 650 may also include, when desired, decoupling capacitors mounted to the substrate. Decoupling capacitors 659 may, for example, reduce undesired variations in power and ground levels due to rapid impedance changes.

As illustrated, in FIG. 14, supply substrate 650 is electrically coupled to PCB 630 through interconnection elements, such as the resilient interconnection elements noted above. Two interconnection elements are coupled between contact points on PCB 630 and corresponding contact points on supply substrate 650. In one example, power and ground pads are alternated. Thus, an interconnection element is connected to ground contact point or pad 652 of supply substrate 650 and a corresponding ground contact point or pad 632 on PCB 630. Similarly, an interconnection element electrically couples power contact point or pad 654 of supply substrate 650 and power contact point or pad 634 of PCB 630. It is appreciated that in other embodiments, the designation of power and ground contact points or pads may be reversed as necessary.

In addition to the contact points or pads (e.g., contact points or pads 652 and 654), supply substrate 650 is provided with edge connectors. Referring to FIG. 14 and FIG. 15, signals such as ground and power may be conveyed from PCB 630 to contact points or pads 652 and 654 of supply substrate 650, to edge connectors 656 (through respective conductive layers 651 and 653) of space transformer 640. These ground and power signals are conveyed from the edge of space transformer 640, through conductive traces (e.g., conductive trace 641) in the space transformer substrate, to contact points or pads (e.g., contact point 642) on the top surface (as viewed) of space transformer 640. Referring to FIG. 15, in one embodiment, edge connectors 656 alternate between power and ground, in one aspect, to lower the inductance of the connection. The edge connectors are coupled to corresponding edge connectors on space transformer 640 through, for example, solder or pressure connections. Edge connector substrates are described in commonly-owned U.S. Pat. No. 6,050,829, titled "Making Discrete Power Connections to a Space Transformer of a Probe Card Assembly," incorporated herein by reference.

As illustrated in FIG. 14, signals such as power and ground are carried to the top (as viewed) surface of space transformer 640 through supply substrate 650. Other connections (e.g., signal connections) may be made directly through the PCB in a manner similar, for example, to that described above, for example, with respect to FIG. 10 and the accompanying text. As illustrated, interconnection elements 655 electrically couple contact points on a surface of cable interface 120 with contact points 633 on a lower surface (as viewed) of PCB 630. Similarly, interconnection elements 680 electrically couple contact points 636 on an upper surface (as viewed) of PCB 630 to contact points 643 on a lower surface (as viewed) of space transformer 640. Considerations regarding pitch of the various contact points and interconnection elements described above, for example, with reference to FIG. 10 are applicable here.

Conductors, such as copper wires or coaxial cables may be designated to carry supply and return signals to and from the test processor or other power source. In this example, conductors may be coupled between PCB 630 and a test processor or other power source.

Figure 16:
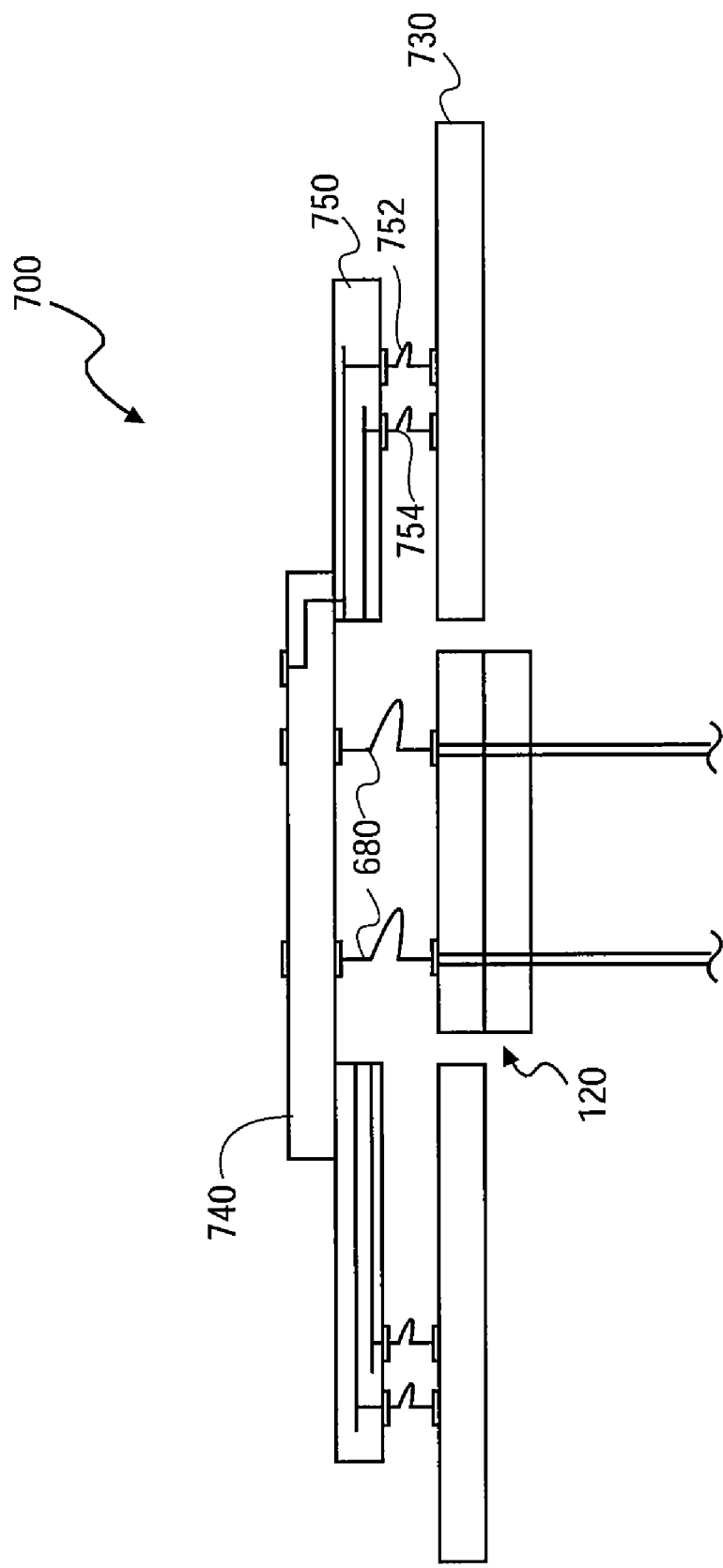
FIG. 16 shows a schematic cross-sectional side view of a fifth embodiment of a testing system.

FIG. 16 shows still another test assembly configuration. In this embodiment, test assembly 700 includes space transformer 740, interposer 730, and cable interface 120. Test assembly 700 also includes supply substrate 750 and interconnection elements such as the resilient interconnection elements described above, to electrically couple signals such as power and ground between interposer 730 and supply substrate 750. FIG. 16 shows interconnection elements 752 and 754 (two of possibly many shown) for coupling power and ground between supply substrate 750 and space transformer 740. The considerations above with regard to the configuration of supply substrate 750 with alternating conductors and insulating layers is applicable here. Supply substrate 750 also includes a plurality of edge connectors for coupling to edges of space transformer 740 in a manner similar to that described above with respect to FIGS. 14 and 15 and the accompanying text, to bring, for example, power and ground to a top surface (as viewed) of space transformer 740.

As illustrated in FIG. 16, cable interface 120 is electrically coupled directly to space transformer 740. In this instance, interconnection elements 680, such as the resilient interconnection elements described above, are coupled between contact points on an upper (as viewed) surface of cable interface 120 and a bottom (as viewed) surface of space transformer 740.

In the above description, examples of a cable interface are described. A use of the cable interface is also described in testing assemblies as, for example, a replacement for conventional probe card and pogo pins. It is appreciated that the cable interface described is suitable in other applications where, for example, it may be desirous to reduce the inductance effects of multicomponent systems with a single interface.

In the preceding detailed description, specific embodiments of cable interfaces and test assemblies are presented. Embodiments of techniques for routing signals in, for example, a cable interface or test system are also described. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method comprising:
   providing a plurality of cables in an array, the plurality of cables comprising respective conductors each having a first end and a second end, and having the first ends disposed in a plane of a body of the array, the first ends disposed at a pitch suitable for interfacing with one or more chip-scale components; and
   forming a dielectric material in place around the first ends to hold the first ends, wherein the first ends are exposed on a surface of the dielectric material; and
   introducing contact pads onto the respective first ends of the plurality of cables.

2. The method of claim 1, wherein providing a plurality of cables in an array comprises:
   providing a substrate comprising a plurality of holes spaced at the pitch suitable for interface with one more chip-scale components; and
   inserting the first ends of the plurality of cables though the plurality of holes.

3. The method of claim 1, wherein forming a dielectric material in place around the first ends comprises:
   potting the plurality of cables in the dielectric material; and
   planarizing a surface of the dielectric material to expose the first ends.

4. The method of claim 1, wherein introducing contact pads over the respective conductors comprises coating the first ends with a conductive material.

5. The method of claim 1, further comprising routing signals through the conductors of the plurality of cables between a first electronic component and a second electronic component.

6. The method of claim 5, wherein the first electronic component is a testing component, the method further comprising:
   coupling the conductors of the plurality of cables to an interconnection component comprising a plurality of contact points corresponding to contact points of the second electronic component.

7. The method of claim 6, wherein coupling the conductors to an interconnection component further comprises modifying a contact pitch of the conductors to a contact pitch of the second electronic component.

8. The method of claim 5, wherein the conductors of the plurality of cables comprise first conductors and routing signals comprises routing data signals, the method further comprising:
   assembling second conductors designated as supply and return lines in a second different array; and
   routing supply and return through the second conductors between the first electronic component and the second component.

9. The method of claim 4, further comprising patterning the conductive material to form the contact pads.

* * * * *